United States Patent [19]

Green

[11] Patent Number: 5,245,663
[45] Date of Patent: Sep. 14, 1993

[54] BACK-MASKING EFFECT GENERATOR

[76] Inventor: Omar Green, 1124 W. 34th St., Riviera Beach, Fla. 33404

[21] Appl. No.: 889,648

[22] Filed: May 28, 1992

[51] Int. Cl.$^5$ .............................................. H03G 3/00
[52] U.S. Cl. ...................................... 381/61; 381/63; 84/603
[58] Field of Search ...................... 381/61, 63; 84/603, 84/604, 605, 606, 602

[56] References Cited

U.S. PATENT DOCUMENTS

4,947,723  8/1990  Kawashima et al. .................. 84/603
5,090,291  2/1992  Schwartz ............................. 84/603

Primary Examiner—Jin F. Ng
Assistant Examiner—Ping Wong
Attorney, Agent, or Firm—Wolf, Greenfield & Sacks

[57] ABSTRACT

The invention comprises a back-masking effect generator which produces, almost in real time, the simulated sound of an input audio signal being reproduced in reverse. The device digitally records the sound in packets of short duration with alternating packets being written to first and second static random access memory devices, respectively. After an initial state in which the first memory device is filled with the digitized input audio signal, the generator then continuously alternates between two other states. In one state, the second memory device is filled while the first memory device is simultaneously emptied to a digital-to-analog converter in the reverse order from which it was filled. In the other state, the first static random access memory is filled while the second memory device is simultaneously emptied to the digital-to-analog converter.

19 Claims, 6 Drawing Sheets

Fig. 1

| CONTROL LINE | 0<br>Start<br>State | 1<br>Initiation<br>State | 2<br>First<br>Alternating<br>State | 3<br>Second<br>Alternating<br>State | 4<br>Bypass<br>State |
|---|---|---|---|---|---|
| ENABLE control line 24 of Input Register 18 | NOT ASSERTED | ASSERTED | NOT ASSERTED | ASSERTED | ASSERTED |
| ENABLE control line 68 of Output Register 62 | NOT ASSERTED | ASSERTED | ASSERTED | NOT ASSERTED | ASSERTED |
| ENABLE control line 26 of Input Register 20 | NOT ASSERTED | NOT ASSERTED | ASSERTED | NOT ASSERTED | NOT ASSERTED |
| ENABLE control line 70 of Output Register 66 | NOT ASSERTED | NOT ASSERTED | NOT ASSERTED | ASSERTED | NOT ASSERTED |
| READ/WRITE control line 36 of SRAM 32 | DEFAULT | WRITE | READ | WRITE | DEFAULT |
| READ/WRITE control line 38 of SRAM 34 | DEFAULT | DEFAULT | WRITE | READ | DEFAULT |
| COUNT control line 44 of counter 40 | NOT ASSERTED | COUNT | COUNT | COUNT | NOT ASSERTED |
| UP/DOWN control line 46 of counter 40 | DEFAULT | UP | DOWN | UP | DEFAULT |
| COUNT control line 56 of counter 52 | NOT ASSERTED | NOT ASSERTED | COUNT | COUNT | NOT ASSERTED |
| UP/DOWN control line 58 of counter 52 | DEFAULT | DEFAULT | UP | DOWN | DEFAULT |
| CLEAR control line 50 of counters 40 and 52 | CLEAR | NOT ASSERTED | NOT ASSERTED | NOT ASSERTED | NOT ASSERTED |

Fig. 3E

BACK-MASKING EFFECT GENERATOR

FIELD OF THE INVENTION

The invention pertains to audio signal processing equipment. More particularly, the invention pertains to an apparatus for simulating in real time the sound of an audio signal being reproduced in reverse.

BACKGROUND OF THE INVENTION

In popular music, audio sources are frequently reproduced in reverse as part of a passage in a musical piece. This effect is typically achieved by recording an audio source onto magnetic tape and then playing the tape backwards on a special tape recorder. The sound of an audio source reproduced in reverse, such as a human voice, produces an interesting and often pleasing effect within a musical piece.

More recently the effect has been achieved, particularly in rap-style music, by playing a phonograph record backwards. This is accomplished by playing a phonograph record in its normal counter clockwise direction and, when the effect is desired, grasping the record and pushing it in a clockwise rotation momentarily so that the phonograph needle reproduces the recorded signal in reverse. This technique is commonly known as "scratching", presumably due to the type of sound produced, and is frequently used in rap-style music.

The effect of playing a sound sample in reverse cannot be accomplished in real time with the existence of the original sound source because a sound sample must first be recorded in its entirety before the sample can be reproduced in reverse. A sound cannot be reproduced, in forward or reverse, before it exists.

Further, since the advent of compact disc technology, phonograph records are becoming increasing less common. Accordingly, the availability of LP records for performing "scratching" is becoming a problem.

Therefore, it is an object of the present invention to provide a back-masking effect generator which simulates the sound of playing an input audio source in reverse almost in real time.

It is another object of the present invention to provide a back-masking effect generator which can simulate the sound of "scratching".

It is a further object of the present invention to provide a back-masking effect generator which can be used in live performances without the need for a prerecorded audio signal.

SUMMARY OF THE INVENTION

The present invention comprises two static random access memory devices (SRAMs), each having an associated counter or series of counters, an input register and an output register. The device further comprises an analog-to-digital converter for receiving an input audio signal and providing a sampled digital output stream to the SRAMs, and a digital-to-analog converter at the outputs of the SRAMs for encoding analog signals from the SRAM's digital contents. All of the components are controlled by a finite state machine.

In operation, the finite state machine controls the components such that in an initial state, one of the SRAMs receives the digitally converted input audio data from the analog-to-digital converter and stores it incrementally in memory. When the first SRAM is full, the device is switched to a first of two continuous operating states. In the first continuous operating state, the first SRAM's memory is read out to the digital-to-analog converter in the reverse order from that in which it was written while, simultaneously, the second SRAM is incrementally filled by the analog-to-digital converter with the digitally converted input audio signal.

The two SRAMs operate at the same speed so that the first SRAM will be completely emptied at the same time that the second SRAM becomes completely filled. At that point, the device enters the second continuous operating state in which the operation is reversed so that the second SRAM is emptied to the digital-to-analog converter in the reverse order from which it was filled, while the first SRAM receives and stores data from the analog-to-digital converter. The finite state machine then continuously switches between the first and second continuous operation states (until the device is turned off).

If, for example, the SRAMs receive data from the analog-to-digital converter at 51.2 KHz and each has a 32K memory, each SRAM will take approximately one half of a second to fill (actually 0.64 seconds). The present invention would require only a half-second delay, for instance, between the initial audio input and the initial back-masked audio output. The half second delay can be made substantially unnoticeable by passing the first half-second of data directly to the digital-to-analog converter as it is being stored. In that case, there would be no delay, but the first half second of sound would not be reversed.

The output of the present invention is a series of half-second (or other length) packets of audio, each packet reproduced in reverse. While the data comprising each packet is output in reverse, it should be understood that the packets themselves are output in the same chronological order in which they were received. The back-masked output of the present invention sounds similar to a pre-recorded audio signal being reproduced in reverse.

DETAILED DESCRIPTION OF THE INVENTION

Figure 1:
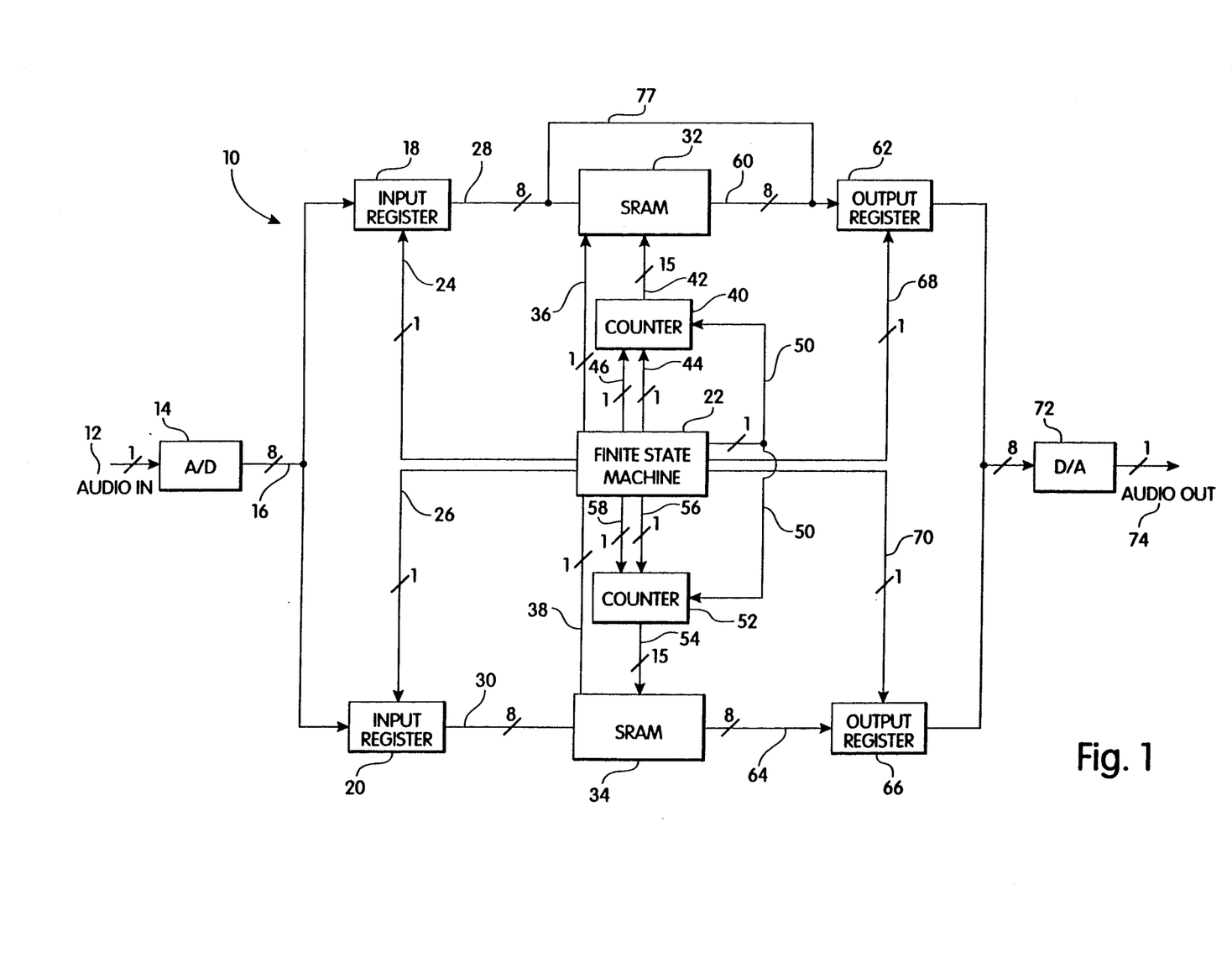
FIG. 1 is a block diagram of the back-masking effect generator of the present invention.

FIG. 1 shows a block diagram of the back-masking effect generator of the present invention. An audio input signal 12 is input to an analog-to-digital converter (A/D) 14. The A/D converter 14 samples the input signal 12 at a specified rate, which, in one preferred embodiment is 51.2 KHz, and produces an 8-bit digital output. Although not shown, it may be desirable to have a low pass filter between the audio input 12 and A/D converter 14 in order to prevent aliasing. The output 16 of the A/D converter 14 is fed to the input of input registers 18 and 20. As explained in further detail herein, the operation of the input registers 18 and 20 is controlled by finite state machine (FSM) 22 via OUTPUT ENABLE control lines 24 and 26, respectively, such that only one of the input registers passes data at any given time. The outputs 28 and 30 of input registers 18 and 20 are fed to the data inputs of the static random access memories (SRAMs) 32 and 34, respectively. Finite state machine 22 controls SRAMS 32 and 34 via READ/WRITE control lines 36 and 38, respectively, such that the SRAM has data written to it only when its corresponding input register is on.

In one preferred embodiment, SRAMs 32 and 34 comprise 32K memory locations, each location comprising eight bits of data. SRAM 32 is addressed by counter 40 via address lines 42. In at least one preferred embodiment, the counter, such as counter 40, actually comprises four clustered 74LS169 counters. Counter 40 is controlled by FSM 22 via control lines 44, 46 and 50. SRAM 34 is addressed by counter 52 via address lines 54. Counter 52 is controlled by FSM 22 via control lines 50, 56 and 58.

Control line 50, which controls both counters 40 and 52, is a CLEAR line which clears the counters (i.e., sets them to zero) at initiation. Control lines 46 and 58 control their respective counters to count up or down. Control lines 44 and 56 control their respective counters to count or not to count. Output 60 of SRAM 32 is fed to the input of output register 62. Output 64 of SRAM 34 is fed to the input of output register 66. Output register 62 and 66 are controlled by FSM 22 via OUTPUT ENABLE control lines 68 and 70 such that only one of them is transmitting data at any given time. The outputs of output registers 62 and 66 are fed to the input of 8-bit digital-to-analog converter 72. The output of digital-to-analog converter 72 comprises the audio output 74 of the device.

In operation, the audio input signal is converted to digital data by A/D converter 14. FSM 22 is an eight state finite state machine. There are five principal operating states, termed herein 1) the start state, 2) the by-pass state, 3) the initial state, 4) the first continuous operation state, and 5) the second continuous operation state. The remaining three states comprise trap states in case the device enters an illegal condition.

In the start state, which is entered when the machine is turned on or reset, FSM 22 merely asserts CLEAR line 50 causing the counters 40 and 52 to initialize to 0 and maintains all registers in the off state via OUTPUT ENABLE control lines 24, 26, 68, and 70.

In the preferred embodiment, the back-masking effect is operated by a foot pedal. FSM 22 enters the initial operating state, when the back-masking effect is first turned on by the foot pedal. In the initial operating state, when data is made available from the analog-to digital converter, FSM 22 turns input register 18 on via OUTPUT ENABLE control line 24, write enables SRAM 32, via READ/WRITE control line 36, so that SRAM 32 accepts and stores the data written to it by input register 18, and instructs counter 40, via COUNT control line 44 and UP/DOWN control line 46, to sequentially address SRAM 32 from 0 to 32,767 such that the memory of SRAM 32 is sequentially filled with the data from A/D converter 14 until it is full.

In a preferred embodiment, in this initial operating state, FSM 22 also turns on output register 62. Accordingly, the data which is being recorded into SRAM 32 is also simultaneously output to digital-to-analog converter 72, thus producing an audio output signal. In this preferred embodiment, there is no gap in the audio output signal when the back-masking effect is first turned on. Of course, the output of the device during the initial operating state is in the normal forward direction and is not yet reversed. Alternately, output register 62 need not be turned on in the initial state, however, it will create a gap in the sound of a duration equal to the duration of the initial operating state.

When SRAM 32 is full, FSM 22 switches to the first continuous operation state, in which it turns input register 18 off via OUTPUT ENABLE control line 24, turns input register 20 on via OUTPUT ENABLE control line 26, write enables SRAM 34 via READ/WRITE control line 38 to accept and store the data written to it from input register 20 and instructs counter 52 via COUNT control line 56 and UP/DOWN control line 58 to sequentially address SRAM 34 from 0 to 32,767 such that SRAM 34 is sequentially filled with the output of A/D converter 14. Further, FSM 22 turns output register 62 on via OUTPUT ENABLE control line 68, switches the READ/WRITE control line 36 of SRAM 32 to read enable SRAM 32, and instructs counter 40 to start counting down from 32,767 to 0 via COUNT control line 44 and UP/DOWN control line 46. In this manner, simultaneously with the filling of SRAM 34 with the information from A/D converter 14, the data now stored in SRAM 32 is read out to D/A converter 72 in the reverse sequential order from which it was filled. The output of D/A converter 72 is the audio output of the device. SRAMs 32 and 34 operate at the same speed such that SRAM 34 will become full at the same moment that SRAM 32 becomes completely empty.

At that point, the FSM switches to the second continuous operation state in which the output of A/D converter 14 is switched back to filling SRAM 32 while SRAM 34 is switched from write to read enable and its data is read out in reverse sequential order to digital-to-analog converter 72. In the second continuous operation state, the control line conditions are as follows: OUTPUT ENABLE control line 24 switches input register 18 from the off state to the on state, OUTPUT ENABLE control line 68 switches output register 62 from the on state to the off state, OUTPUT ENABLE control line 26 switches input register 20 from the on state to the off state, OUTPUT ENABLE control line 70 switches output register 66 from the off state to the on state, SRAM 32 is switched from read enabled to write enabled via READ/WRITE control line 36 such that SRAM 32 accepts and stores data written to it from input register 18, SRAM 34 is switched from write enabled to read enabled via READ/WRITE control line 38 such that SRAM 34 is read from by output register 66 and the digital-to-analog converter 72, COUNT control line 44 and UP/DOWN control line 46 instruct counter 40 to begin counting upwards from 0 to 32,767, and COUNT control line 56 and UP/DOWN control line 58 instruct counter 52 to count down from 32,767 to 0.

FSM 22 then continues switching between the first and second continuous operation states until the device is reset or turned off. In this manner, after the initial state, which lasts for the amount of time required to fill SRAM 32 (approximately one half of a second under the parameters discussed above), the device starts producing a back-masked version of the input signal as it is being received. During the initial state, the input audio signal is still being output from output 72 in the normal forward direction as discussed above.

Essentially, the output signal comprises a series of data packets, each data packet comprising a half second of the input signal reproduced in reverse. The data packets themselves, however, are reproduced in the order in which they were received. In other words, although each packet comprises the input signal reproduced in reverse, the packets are reproduced in the order in which they were received such that the first packet comprises the first half-second of the input signal in reverse, the second packet comprises the second half-second of the input signal in reverse, the third packet comprises the third half-second of the input signal in reverse, and so on.

The half-second packets are played continuously without interruption and, therefore, the human ear does not perceive any disruption in the output sound as the SRAMs are switched. Further, although the input audio signal is not actually being reproduced in reverse from end to beginning (unless it lasts less than half a second), but is rather played in reverse in half-second packets, the sound typically is substantially similar to the sound which would be created by playing the input audio signal in reverse on a reversible audio tape deck.

By using a larger memory, and/or slower sampling rates, the duration of the packets can be increased. Also, it is not necessary that the entire SRAM be filled before switching states. Accordingly, less than all of the SRAM can be filled before switching states in order to decrease the duration of the packets, if desired. In the preferred embodiment, the amount of memory which is filled before switching states (and thus the duration of the packets) is adjustable.

In the bypass state, the audio input signal is sent directly from A/D converter 14 to input register 18, and then, via path 77, to output register 62 and D/A converter 72. This path is the same path discussed above with respect to the initial state in which, when the backmasking is first switched on, the input audio signal is reproduced at the output 72 in the forward direction.

Figure 2:
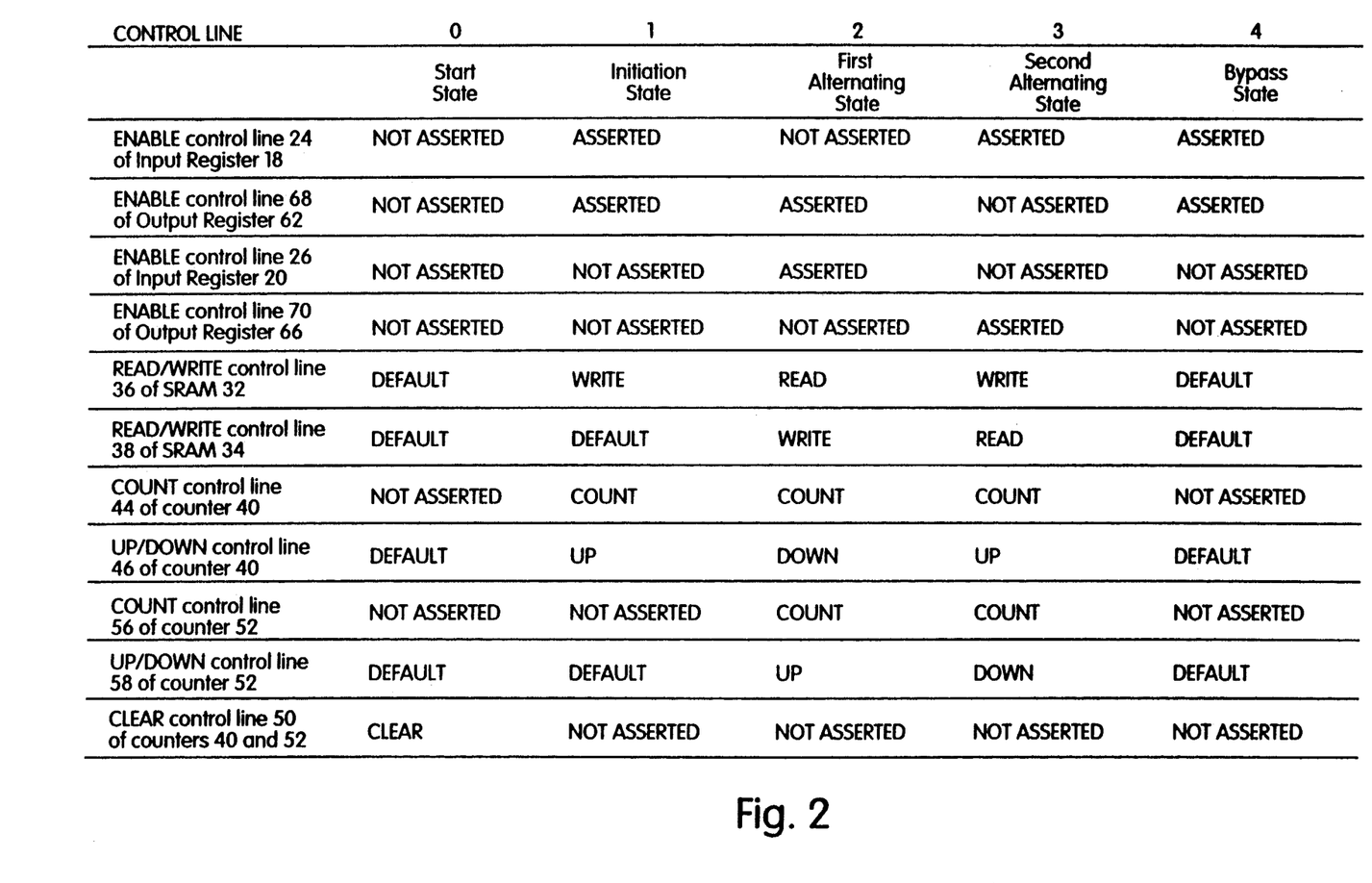
FIG. 2 is a table showing the condition of control lines of the device of the present invention in each of its four primary operating states.

FIG. 2 is a table showing the condition of the eleven control lines for the five operating states described above, namely 1) the start state, 2) the initial state when SRAM 32 is first filled, 3) the first continuous operation state in which SRAM 32 is emptied while SRAM 34 is simultaneously filled, 4) the second continuous operation state in which SRAM 32 is filled while SRAM 34 is simultaneously emptied and 5) the bypass state.

FIGS. 3A-3E comprise flow charts showing the operation of the present invention.

Figure 3A:
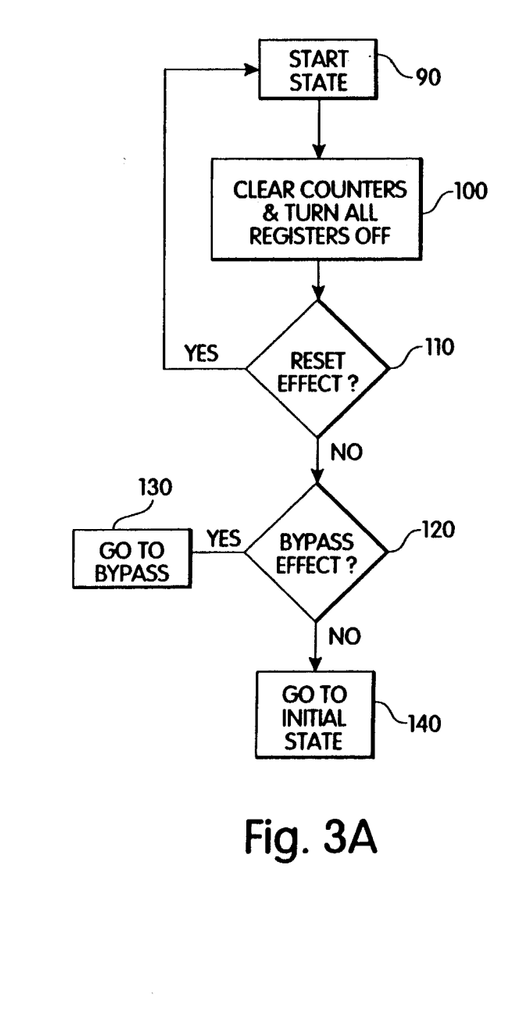
FIGS. 3A-3E are a series of flow charts illustrating the operation of the back-masking effect generator of the present invention.

FIG. 3A illustrates the operation of the device when in the START state. When power to the device is switched on, the device automatically enters the START state at step 90. In step 100, the counters are cleared and all registers are disabled. In step 110, the FSM checks if the reset button has been pressed. If so, the device simply goes back to step 90. If the reset button has not been pressed, programming proceeds to step 120, in which the FSM determines if the "bypass effect" button has been pressed. If so, operation proceeds to step 130 and enters the BYPASS state. If not, operation proceeds to step 140 and the device enters the previously described INITIAL state.

Figure 3B:
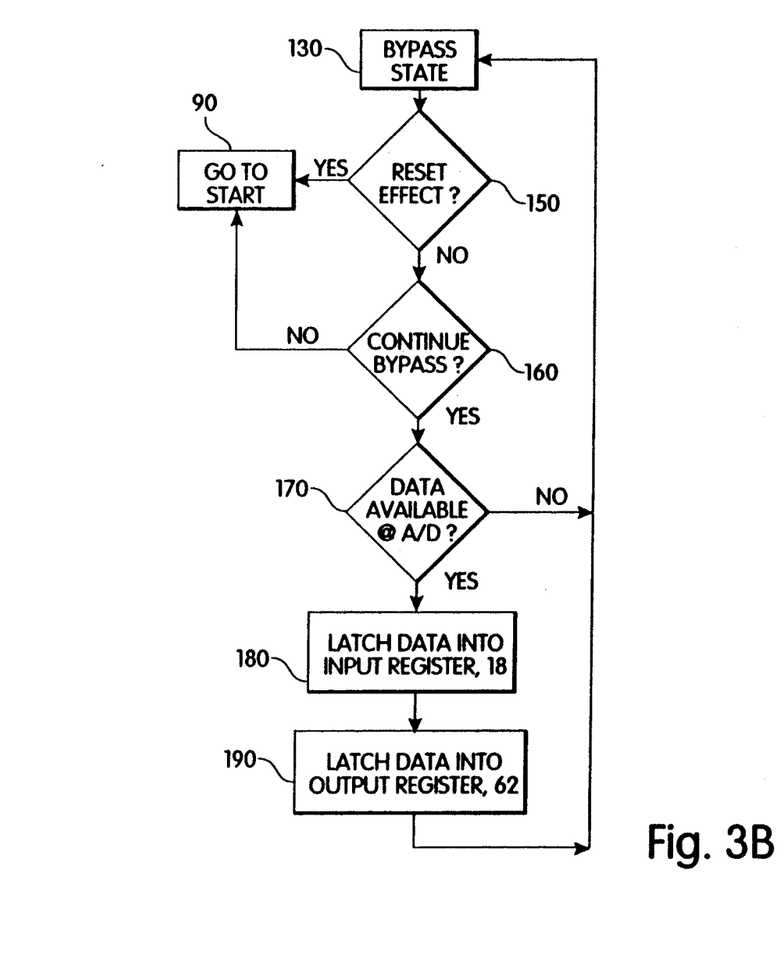

FIG. 3B shows the operation of the device in the BYPASS state. In step 150, if the reset button has been pressed, operation flows back to step 90 of the START state. If the reset button has not been pressed, operation proceeds to step 160, in which, the FSM inquires if the "bypass effect" button has been released. If it has been released, programming flows back to step 90 in the START state. If the device is still in the BYPASS mode, operation proceeds to step 170 in which, if data is not available at the output of the analog-to-digital converter, operation loops back around to step 130 at the beginning of the bypass step. If data is available, input register 18 and output register 62 are enabled in steps 180 and 190. Accordingly, in the BYPASS state, data is passed directly from input register 18 to output register 62 so that the input audio signal is reproduced at the output 72 of the device in its normal forward direction. Operation then loops around back to step 130 of the BYPASS state and continues through the loop shown in FIG. 3B until the device is turned off or the "bypass effect" button is released.

Figure 3C:
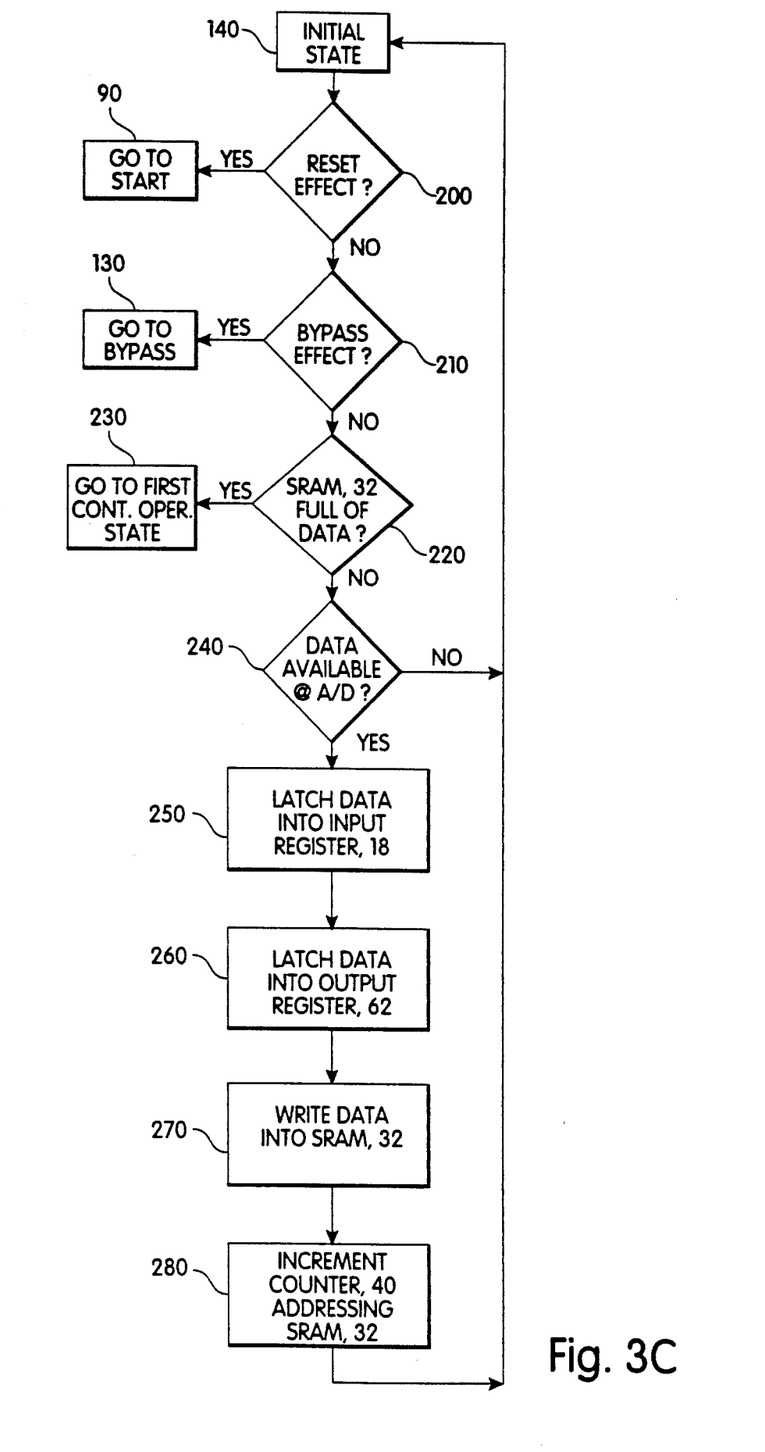

FIG. 3C illustrates the operation of the device after it has entered the INITIAL state through steps 120 and 140 in the start state flowchart shown in FIG. 3A. In steps 200 and 210, it first determines if the device has been reset or if the bypass button has been pressed. If the system has been reset, operation goes back to step 90 in the START state. If the bypass button has been pressed, operation goes back to step 130 of the BYPASS state. If the effect is still selected step 220 determines if SRAM 32 is full of data. If it is, operation proceeds to step 230 which is the first step of the first continuous operation state. However, if SRAM 32 is not full, operation proceeds to step 240, in which, if data is not available from the analog-to-digital converter, operation loops back around to step 140 of the INITIAL state. However, if data is available, input register 18 is enabled in step 250, output register 62 is enabled in step 260 and SRAM 32 is instructed to receive and store data written to it in step 270. In step 280, the counter 40 associated with SRAM 32 is incremented and operation loops back around to step 140. The device will continue in the initial state loop shown in FIG. 3C until SRAM 32 is determined to be full in step 220 or until either the reset button or the bypass button is pressed. When SRAM 32 is determined to be full in step 220, operation proceeds to step 230 of the first continuous operation state.

Figure 3D:
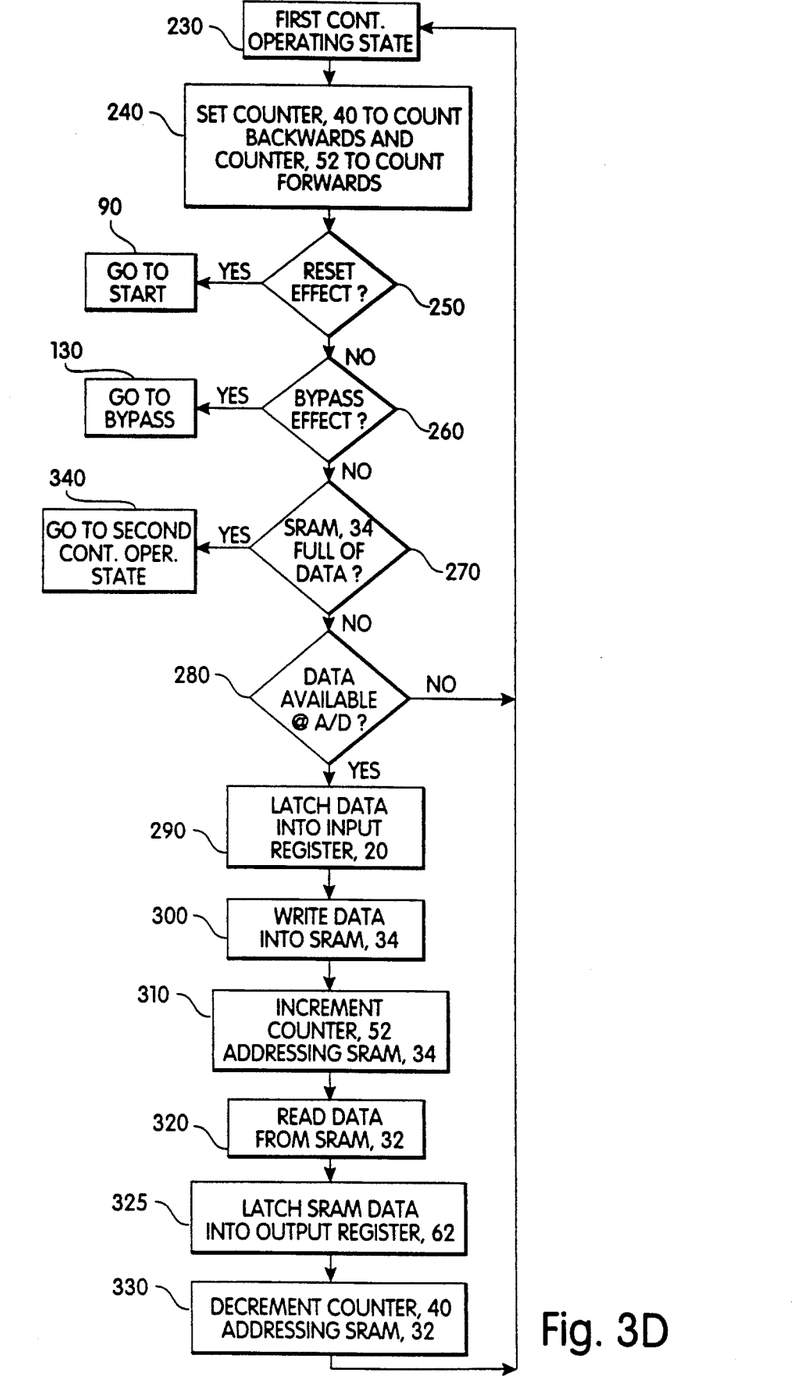

FIG. 3D shows the operation of the device in this first continuous operation state. In step 240, counter 40 is instructed to count backwards. In steps 250 and 260, if the reset or bypass buttons have been pressed, operation returns to the START state or BYPASS state, respectively. If not, operation proceeds to step 270 in which, if the second SRAM, SRAM 34, has not been filled, operation proceeds to step 280. In step 280, it is determined if data is available from the analog-to-digital converter. If not, operation is returned to step 230. If data is available, input register 20 of SRAM 34 is enabled in step 290 and SRAM 34 is instructed to receive and store data written to it in step 300. In step 310, counter 52 associated with SRAM 34 is instructed to increment. In step 320, the FSM instructs SRAM 32 to read out its data and, in step 325, enables output register 62 associated with SRAM 32 to accept the data. In step 330, the FSM instructs counter 40 to decrement and operation loops around back around to step 230. Programming continues in the loop shown in FIG. 3D until the reset button or bypass button is pressed or until SRAM 34 is determined to be full in step 270. When SRAM 34 is determined to be full, operation proceeds to step 340 and the second continuous operation state illustrated by FIG. 3E.

Figure 3E:
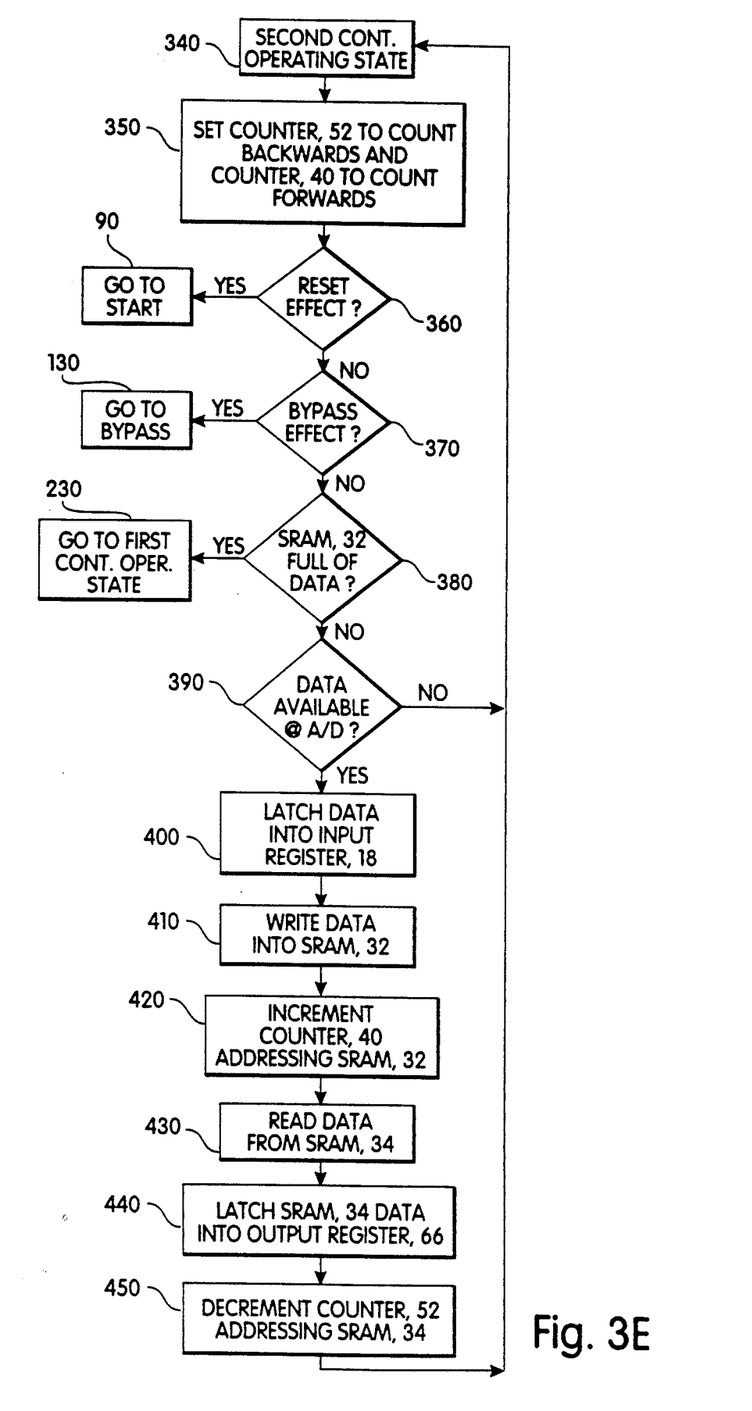

Referring to FIG. 3E, in the second continuous operation state, counter 52 is set to count backwards in step 350. In steps 360 and 370, if the reset button or the bypass button has been pressed, operation returns to the start state or the bypass state, respectively. If neither button has been pressed, operation flows to step 380 in which it is determined if SRAM 32 has been filled with data. If not, operation continues to step 390 in which it is determined if data is available from the analog-to-digital converter. If not, flow loops back to step 340. If data is available, operation proceeds to step 400 in which input register 18 associated with the first SRAM 32 is enabled. Further, in step 410, SRAM 32 is instructed to receive and store data. In step 420, associated counter 40 is incremented. In step 430, SRAM 32 is instructed to output data. In step 440, output register 66 associated with SRAM 34 is enabled. Finally, in step 450, counter 52 associated with SRAM 34 is decremented and operation flows back to step 340 to loop through the operation illustrated on FIG. 3E again. Unless the device is reset or the bypass button is selected, the device continues to perform the steps of the second continuous operation state illustrated in FIG. 3E until SRAM 32 is determined to be full in step 380. At that point, operation is returned to the top (step 230) of the first continuous operation state illustrated in FIG. 3D.

In order to simulate the sound of "scratching" the operator of the device may wish to switch the bypass mode on and off at selected intervals such that the output is first in forward direction then in reverse direction and then back in forward direction and so on as is the case in scratching with an LP record. Alternately, the FSM can be modified to provide a mode in which this is done automatically. It is also possible to provide an additional mode in which data is read out of the SRAMs in reverse order for a specified interval and later read out of the SRAM in the forward order for a second specified interval. This mode would also simulate the alternating forward and reverse effect of "scratching".

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A back-masking effect generator comprising;
an analog-to-digital converter having an input coupled to receive an input audio signal and having an output,
first and second memory storage devices having inputs coupled to receive said output of said analog-to digital converter, each memory storage device having a plurality of memory locations and an output,
a digital to-analog converter having an input coupled to receive said outputs of said memory storage devices and having an analog output, and
means for controlling data flow in said generator comprising,
means for causing said first memory storage device to store data received from said analog-to-digital converter in said plurality of memory locations for a first specified time period,
means for causing said first memory storage device to write said data stored therein to said digital to-analog converter, during a second specified time period, in the reverse order from which it was received,
means for causing said second memory storage device to store data received from said analog-to-digital converter in said plurality of memory locations during said second specified time period,
means for causing said second memory storage device to write said data stored therein to said digital-to-analog converter, during a third specified time period, in the reverse order from which it was received, and
means for causing said first memory storage device to store data received from said analog-to-digital converter in said plurality of memory locations during said third specified time period.

2. A back-masking effect generator as set forth in claim 1 further comprising an input register and an output register corresponding to each of said first and second memory storage devices.

3. A back-masking effect generator as set forth in claim 2 wherein said means for controlling data flow comprises a finite state machine.

4. A back-masking effect generator as set forth in claim 3 wherein said means for controlling data flow further comprises a counter associated with each of side memory storage devices for addressing said corresponding memory storage device under control of said finite state machine.

5. A back-masking effect generator as set forth in claim 4 wherein said first and second memory storage devices comprise static random access memory devices.

6. A back-masking effect generator comprising;
an analog-to-digital converter having an input coupled to receive an input audio signal and having an output,
first and second input registers having inputs coupled to said output of said analog-to-digital converter,
first and second memory storage devices having inputs coupled to said first and second input registers, respectively, each memory storage device having a plurality of memory locations and an output,
first and second output registers having inputs coupled to said first and second memory storage devices, respectively, and having outputs,
first and second counters for sequentially addressing said first and second memory storage devices, respectively,
a digital-to-analog converter having an input coupled to the outputs of said output registers and having an analog output,
a finite state machine for controlling said counters, input registers, output registers and memory storage devices so as to continuously cause said back-masking effect generator to switch between first and second states of operation, wherein,
in said first state, said input audio signal is written into said first memory storage device while an immediately preceding chronological portion of said input audio signal is simultaneously read out of said second memory storage device in the reverse order from which it was received, and
in said converted second state, said input audio signal is written into said second memory storage device while an immediately preceding chronological portion of said input audio signal is simultaneously read out of said converted first memory storage device in the reverse order in which it was stored.

7. A method of simulating the sound of an input audio signal reproduced in reverse comprising the steps of;
(1) converting said input audio signal to digital data as it is being received,
(2) storing a segment of said input audio signal in a first set of memory locations,
(3) outputting the contents of said first set of memory locations in the reverse order in which they were received while simultaneously storing another segment of said input audio signal as it is being received in a second set of memory locations,
(4) outputting the contents of said second set of memory locations in the reverse order in which they were received while simultaneously storing yet another segment of said input audio signal in said first set of memory locations as it is being received, and
(5) repeating steps (3) and (4).

8. A method as set forth in claim 7 wherein the duration of steps (2), (3), and (4) are equal.

9. A method as set forth in claim 8 wherein the duration of steps (2), (3), and (4) are approximately one half of a second.

10. A method as set forth in claim 7 wherein steps (3) and (4) further comprise the step of converting the contents of said sets of memory locations from digital data to analog data as they are read out of said memory locations.

11. A method as set forth in claim 7 further comprising the step of outputting said segment of said input audio signal which is stored in step (2), simultaneously with step (2).

12. A back-masking effect generator comprising;
an analog-to-digital converter having an input coupled to receive an input audio signal and having an output,
first and second memory storage devices having data inputs coupled to said output of said analog-to-digital converter, each memory storage device having a plurality of memory locations and an output,
a digital to-analog converter having an input coupled to said outputs of said memory storage devices and said analog-to-digital converter and further having an analog output, and
means for controlling data flow in said generator so as to cause said back-masking effect generator to initially enter a first state and thereafter to continuously switch between second and third states of operation, wherein,
in said first state, a portion of said input audio signal is written into said first memory storage device as it is received and is simultaneously passed directly to said digital-to-analog converter,
in said second state, a portion of said input audio signal is written into said second memory storage device as it is received while an immediately preceding portion of said input audio signal which was previously stored in said first memory storage device is simultaneously read out of said first memory storage device in the reverse chronological order in which it was stored, and
in said third state, a portion of said input audio signal is written into said first memory storage device as it is received while an immediately preceding chronological portion of said input audio signal is simultaneously read out of said second memory storage device in the reverse chronological order in which it was stored.

13. A back-masking effect generator as set forth in claim 12 wherein said first and second states are of equal duration.

14. A back-masking effect generator as set forth in claim 13 wherein said first and second memory storage devices have equal memory capacity and the duration of said first and second states is not greater than the amount of time needed to completely fill said first and second memory devices to capacity.

15. A back-masking effect generator as set forth in claim 14 wherein said first and second memory storage devices comprise 32K memory locations, said analog-to-digital converter converts said input audio signal at a rate of 51.2KHz, said data is stored in said memory storage devices at a rate of 51.2KHz, whereby said duration of said first and second states is approximately one half of a second.

16. A back-masking effect generator as set forth in claim 15 further comprising an input register and an output register corresponding to each of said first and second memory storage devices.

17. A back-masking effect generator as set forth in claim 16 wherein said means for controlling data flow comprises a finite state machine.

18. A back-masking effect generator as set forth in claim 17 wherein said means for controlling data flow further comprises a counter associated with each of said memory storage devices for sequentially addressing said corresponding memory storage device under control of said finite state machine.

19. A back-masking effect generator as set forth in claim 18 wherein said memory storage devices comprise static random access memory devices.

* * * * *